US006365934B1

(12) United States Patent
Storino et al.

(10) Patent No.: US 6,365,934 B1
(45) Date of Patent: *Apr. 2, 2002

(54) METHOD AND APPARATUS FOR ELIMINATION OF PARASITIC BIPOLAR ACTION IN COMPLEMENTARY OXIDE SEMICONDUCTOR (CMOS) SILICON ON INSULATOR (SOI) CIRCUITS

(75) Inventors: Salvatore N. Storino; Andrew Douglas Davies, both of Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/240,244

(22) Filed: Jan. 29, 1999

(51) Int. Cl.[7] .......................................... H03K 19/096
(52) U.S. Cl. ........................ 257/347; 257/348; 257/349; 257/350; 257/351; 257/352; 257/353; 257/354; 257/355
(58) Field of Search ................................ 257/347–355

(56) References Cited

U.S. PATENT DOCUMENTS

| 4,893,158 | A |   | 1/1990 | Mihara et al. ............ 357/23.13 |
| 5,627,395 | A |   | 5/1997 | Witek et al. ................. 257/350 |
| 5,742,075 | A |   | 4/1998 | Burns et al. ................... 257/59 |
| 5,748,016 | A |   | 5/1998 | Kurosawa .................... 327/108 |
| 5,770,881 | A |   | 6/1998 | Pelella et al. ................ 257/347 |
| 5,777,491 | A |   | 7/1998 | Hwang et al. ............... 326/113 |
| 5,793,228 | A |   | 8/1998 | Evans ........................... 326/98 |
| 5,831,451 | A |   | 11/1998 | Bosshart ....................... 326/93 |
| 5,917,355 | A |   | 6/1999 | Klass ............................ 327/208 |
| 5,923,071 | A |   | 7/1999 | Saito ............................ 257/458 |
| 5,932,914 | A |   | 8/1999 | Horiguchi .................... 257/355 |
| 5,982,006 | A |   | 11/1999 | Joyner ......................... 257/347 |
| 5,985,728 | A |   | 11/1999 | Jennings ...................... 438/311 |
| 5,994,738 | A |   | 11/1999 | Wollesen ..................... 257/347 |
| 6,002,271 | A |   | 12/1999 | Chu et al. ..................... 326/98 |
| 6,020,222 | A |   | 2/2000 | Wollesen ..................... 438/149 |
| 6,023,089 | A |   | 2/2000 | Kang .......................... 257/347 |
| 6,028,337 | A |   | 2/2000 | Letavic et al. ............... 257/347 |
| 6,031,261 | A |   | 2/2000 | Kang .......................... 257/302 |
| 6,034,399 | A |   | 3/2000 | Brady et al. ................. 257/355 |
| 6,094,072 | A | * | 8/2000 | Davies et al. ................ 257/349 |
| 6,188,247 | B1 | * | 2/2001 | Storino et al. ................. 326/98 |

FOREIGN PATENT DOCUMENTS

| JP | 6112483 | 4/1994 | ......... H01L/29/784 |
| JP | 6204440 | 7/1994 | ........... H01L/27/12 |
| JP | 6209109 | 7/1994 | ......... H01L/29/784 |

OTHER PUBLICATIONS

U.S. Patent application Ser. No. 09/239,289, by Storino et al., "Method and Apparatus for Elimination of Parasitic Bipolar Action in Logic Circuits for History Removal Under Stack Contention Including CMOS SOI Elements", filed Jan. 29, 1999.

U.S. Patent app. Ser. No. 09/240,991, by Tran et al., "Method and Apparatus for Elimination of Parasitic Bipolar Action in Logic Circuits Including Complementary Oxide Semiconductor (CMOS) Silicon on Insulator Elements", filed Jan. 29, 1999.

"Pre–Discharge Technique to Improve Noise Immunity on Silicon–on–Insulator (SOI) Domino Circuits", Research Disclosure, Apr. 1998 No. 408, pp. 496–497, Disclosure by International Business Machines Corporation.

* cited by examiner

*Primary Examiner*—Fetsum Abraham
(74) *Attorney, Agent, or Firm*—Merchant & Gould, P.A.; Roy W. Truelson

(57) ABSTRACT

The present invention is an apparatus and method for eliminating parasitic bipolar transistor action in a Silicon on Insulator (SOI) Metal Oxide Semiconductor (MOS) device. In accordance with the invention a SOI electronic device and an active discharging device coupled to said SOI electronic device is provided to deactivate the parasitic bipolar transistor. The parasitic bipolar transistor action is deactivated by controlling the conduction of an active discharging device, said active discharging device being coupled to said SOI device.

18 Claims, 4 Drawing Sheets

METHOD AND APPARATUS FOR ELIMINATION OF PARASITIC BIPOLAR ACTION IN COMPLEMENTARY OXIDE SEMICONDUCTOR (CMOS) SILICON ON INSULATOR (SOI) CIRCUITS

BACKGROUND OF THE INVENTION

A. Field of the Invention

The invention relates generally to a method and apparatus for reducing the effects of parasitic bipolar discharge of silicon-on-insulator (SOI) electronic devices. More specifically, the invention relates to eliminating the unwanted effect of parasitic bipolar discharge of SOI field effect transistors (FET) in dynamic logic circuits.

B. Description of Related Art

Silicon-on-insulator (SOI) technology is an enhanced silicon technology currently being utilized to increase the performance of digital logic circuits. Utilizing SOI technology designers can increase the speed of digital logic integrated circuits while reducing their overall power consumption. These advances in technology will lead to the development of more complex and faster computer integrated circuits that operate with less power.

In recent years Metal Oxide Semiconductor (MOS) Field Effect Transistor (FET) integrated circuits and Complementary Metal Oxide Semiconductor (CMOS) FETs have gained popularity and are the most widely used type of integrated circuit technology. Today, CMOS electronic devices provide advantages of higher operating speeds, smaller size, lower power consumption, and are increasingly becoming cheaper to manufacture as a result of smaller component size, higher manufacturing production yields per semiconductor wafer, and larger wafer sizes. The most popular integrated circuit devices manufactured utilizing CMOS technology are microprocessors, memory, and digital logic circuits.

Traditional MOS and CMOS semiconductors consist of a metal on an oxide layer that is placed on a silicon substrate. The added impurities in the silicon substrate enable these devices to operate as transistors. On the other hand, SOI semiconductors include a thin layer of silicon placed on top of an insulator, such as silicon oxide or glass, and a MOS transistor built on top of this structure. The main advantage of constructing the MOS transistor on top of an insulator layer is to reduce the internal capacitance of the transistor. This is accomplished by placing the insulator oxide layer between the silicon substrate and the impurities required for the device to operate as a transistor. Reducing the internal capacitance of the transistor increases its operating speed Therefore, with SOI technology faster MOS transistors can be manufactured resulting in higher performance semiconductors to fuel emerging needs for faster electronic devices.

SOI technology has several drawbacks. An inherent drawback of placing a MOS transistor on top of a SOI layer is that the MOS transistor is actually placed in parallel with a bipolar junction transistor. If enough current is passed through the MOS transistor, the parasitic bipolar transistor will turn on. This causes an unwanted effect called bipolar discharge and lowers the performance of the MOS transistor.

High speed CMOS circuits often employ a domino circuit technique that utilizes pre-charging to improve the gate speeds of the transistors. Dynamic circuit nodes are pre-charged during each clock cycle to a certain level. The problem with SOI FETs is that the parasitic bipolar transistor causes bipolar discharge. This is undesirable because it causes an unintended loss of charge on the drain nodes of the dynamic circuit.

Normally, parasitic bipolar action does not manifest itself in conventional, bulk, MOS transistors because the base of the bipolar transistor is always kept at ground potential, keeping the bipolar off. In SOI, the body of the MOS FET device, or base of the bipolar transistor, is floating and can be charged high by junction leakages induced when the drain and source terminals of the MOS FET are at a high potential. Subsequently, if the source is pulled to a low potential, the trapped charge in the base area is available as parasitic base current. The parasitic base current activates the bipolar transistor and generates a collector current at the drain terminal of the MOS FET. The unintentional loss of charge could lead to system failure, for example, by erroneously switching logic state.

As a result, it can be seen that there is a need to minimize the effect of parasitic bipolar transistors in parallel with MOS transistors in dynamic logic circuits.

SUMMARY OF THE INVENTION

The present invention relates generally to a method and apparatus for reducing the effects of parasitic bipolar discharge of silicon-on-insulator (SOI) devices. More specifically, the present invention relates to eliminating the unwanted effect of parasitic bipolar discharge of SOI field effect transistors (FET) in dynamic logic circuits.

In accordance with a preferred embodiment, the present invention provides an apparatus and method to overcome the unwanted effects of parasitic bipolar discharge in silicon-on-insulator (SOI) field effect transistors (FET) by inserting a discharging device at intermediate nodes of the dynamic circuit to keep the voltages at the sources at a low potential. Furthermore, the discharging device is turned on prior to discharging the nodes of the SOI FET in domino logic circuits to disable the body charge of the SOI FET.

In one embodiment, the present invention provides an apparatus for eliminating parasitic bipolar transistor action in a Silicon on Insulator (SOI) Metal Oxide Semiconductor (MOS) device comprising: a SOI electronic device; and an active discharging device coupled to said SOI electronic device, whereby the parasitic bipolar transistor is deactivated.

In another embodiment, the present invention provides, a method of eliminating parasitic bipolar transistor action in a Silicon on Insulator (SOI) Metal Oxide Semiconductor (MOS) device, the method comprising: controlling the conduction of an active discharging device, said active discharging device being coupled to said SOI device, whereby the parasitic bipolar transistor is deactivated.

In yet another embodiment, the present invention provides a Silicon on Insulator(SOI) dynamic logic circuit having an input, an output, and a clock, comprising: a plurality of stacked SOI Metal Oxide Semiconductor (MOS) transistors interconnected to perform a predetermined logic function defining a common node and a plurality of intermediate nodes, said common node being coupled to a pre-charging device and said intermediate node having a corresponding input coupled to said stacked transistors; and a plurality of active discharging transistors interconnected between said intermediate nodes and any one of said corresponding input to said stacked transistors.

In a further embodiment, the present invention provides a method of eliminating parasitic bipolar transistor action in a Silicon on Insulator (SOI) Metal Oxide Semiconductor (MOS) dynamic logic circuit having an input an output, and a clock, comprising a plurality of stacked SOI Metal Oxide Semiconductor (MOS) transistors interconnected to perform a predetermined logic function defining a common node and a plurality of intermediate nodes, said common node being coupled to a pre-charging device and said intermediate nodes having a corresponding input coupled to said stacked transistors; and a plurality of active discharging transistors interconnected between said intermediate nodes and any one of said corresponding inputs to said stacked transistors, the method comprising: controlling the conduction of said active discharging transistors during a pre-charge cycle; and actively discharging said intermediate nodes of the SOI stacked transistors, whereby the parasitic bipolar transistors are deactivated and the charge at said common node is maintained at a predetermined level.

These and various other features and advantages of the present invention will become readily apparent to those skilled in the art from the following detailed description and corresponding drawings. As will be realized, the invention is capable of modification without departing from the invention. Accordingly, the drawing and description are to be regarded as being illustrative in nature, and not as restrictive.

DETAILED DESCRIPTION OF THE ILLUSTRATED EMBODIMENTS

The illustrated embodiment of the invention is principally directed to reducing or eliminating the unwanted effects of the parasitic bipolar transistor in silicon-on-insulator (SOI) field effect transistor (FET) dynamic logic circuits. The dynamic logic circuit may have an input, an output, a clock, and a plurality of stacked SOI Metal Oxide Semiconductor (MOS) FETs interconnected to perform logic functions defining a common node, said common node coupled to a pre-charging device, a plurality of intermediate nodes having a corresponding input coupled to said stacked transistors; and a plurality of active discharging transistors interconnected between said intermediate nodes and any one of said corresponding input to said stacked transistors. The discharging devices actively discharges the intermediate nodes of the stacked SOI FETs during the pre-charge phase of dynamic logic circuits, whereby the parasitic bipolar transistor is deactivated and the charge on the common node is maintained at a high potential level.

Figure 1:
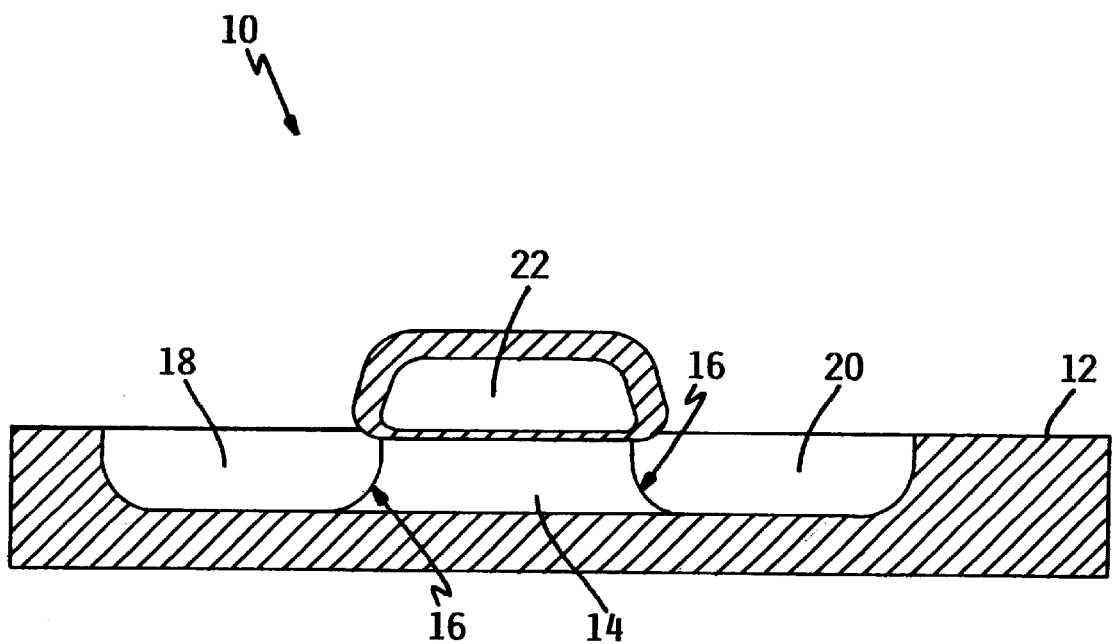
FIG. 1 is a cross sectional diagram of a silicon-on-insulator (SOI) field effect transistor (FET) and a parasitic bipolar transistor.

FIG. 1 illustrates a cross sectional view of a silicon-on-insulator (SOI) negative field effect transistor (NFET) 10 and a parasitic bipolar transistor. The NFET 10 is built on a silicon dioxide,i.e. glass, insulating layer 12. In bulk (non SOI) the base region of the parasitic bipolar transistor is always maintained at ground potential Therefore, no base current is generated and no resulting collector current flows through the bipolar device.

However, in SOI transistors, the body of the FET device 14, or base region of the parasitic bipolar transistor, which lies beneath the gate 22 of the NFET, is floating. The body 14 of the transistor can become charged to a high potential by junction 16 leakage induced whenever both the drain 18 and source 20 terminals are at a high potential. In this illustration the drain 18 of the NFET is the n+ or collector region of the parasitic bipolar and the source 20 is the n+ or emitter region of the parasitic bipolar.

If the body 14 of the FET charges to a high potential and the source 20 is pulled to a low potential, the trapped charge in the body 14, or base region, becomes available as parasitic base current. If the parasitic base current is of sufficient magnitude it will activate the parasitic bipolar transistor and thus generate a collector current at the drain 18. The collector current, flowing in parallel with the drain 18 current, is undesirable as it causes a loss of charge at the drain 18 node of the dynamic circuit.

Figure 2:
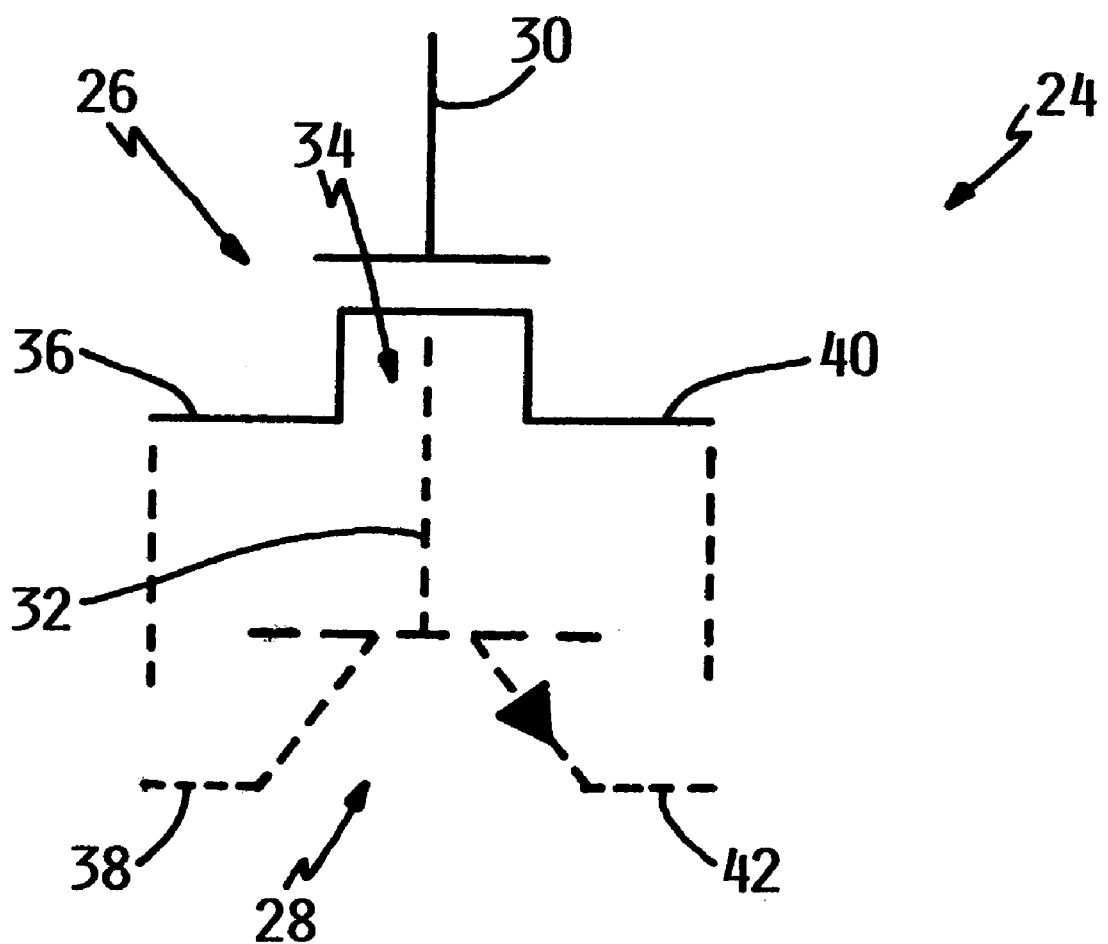
FIG. 2 is an equivalent schematic diagram of the SOI field effect transistor FET and bipolar transistor.

FIG. 2 illustrates an equivalent schematic diagram 24 of the SOI field effect transistor NFET 26 and the parallel parasitic bipolar NPN transistor 28. NFET 26 also includes gate terminal 30. The drain 36 of NFET 26 is equivalent to the collector 38 of the parasitic bipolar transistor 28. Accordingly, the source 40 of NFET 26 is equivalent to the emitter 42 of the parasitic bipolar transistor 28. The body 34 of NFET 26 becomes charged by induced leakage whenever the drain 36 and source 40 terminals are held at a high potential. If the source 40 is dropped to a low potential the trapped charged in the body 34 causes a current to flow from the base 32 of the parasitic bipolar transistor 28. This causes a current to flow in the collector 38 that is parallel to a current flowing in the drain 36. This action discharges the drain 36 node of a dynamic circuit.

Figure 3:
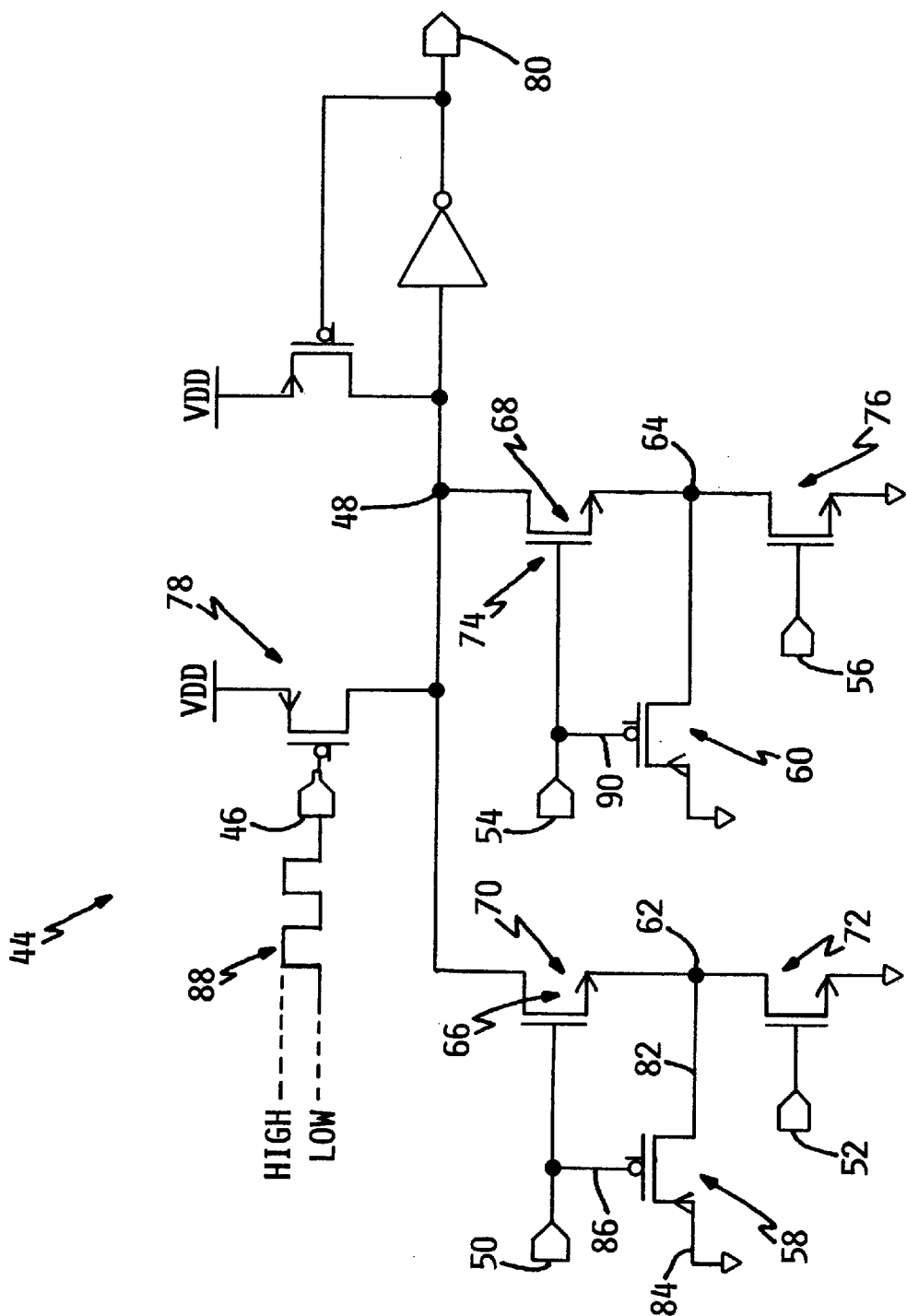
FIG. 3 is a dynamic logic circuit schematic diagram illustrating one embodiment of the present invention that eliminates the unwanted effects of the parasitic bipolar transistor device in SOI FET dynamic circuits.

FIG. 3 is a schematic diagram of a dynamic logic circuit 44 illustrating one embodiment of the present invention. The dynamic logic circuit 44, as illustrated, eliminates the unwanted effects of the parasitic bipolar transistor 28 in SOI FET dynamic circuits. The dynamic circuit includes a clock 88, several inputs, 50, 52, 54, and 56, and an output 80.

The clock input is tied to positive field effect transistor (PFET) 78 through its gate input terminal 46. When the input clock signal 88 is active low, PFET 78 turns on and charges drain node 48 to a high potential. This is referred to as the pre-charge phase in dynamic logic circuits. During the pre-charge phase inputs 50, 52, 54, and 56 are set to a logic low state. While input 50 is in a logic low state, PFET 58 turns on and conducts current from node 62 through drain terminal 82 and through source terminal 84, which is connected to the dynamic circuit's common or ground potential. Similarly, when input 54 is in a logic low state, PFET 60 turns on and conducts current from node 64 through to circuit common or ground. During the pre-charge phase PFETs 58 and 60 actively discharge intermediate nodes 62 and 64 of defined by stacked transistors 70 and 72. Accordingly, bodies 66 and 68 of NFETs 70 and 74, respectively, cannot charge to a high potential. Therefore, the parasitic bipolar transistors in parallel with NFETs 70 and 72 cannot activate because there is insufficient charge built up in bodies 66 and 68 to generate an adequate amount of base current into the parasitic bipolar transistors. By preventing the parasitic bipolar transistors from activating the charge on the drain node 48 of NFETs 70 and 74 is protected from being unintentionally discharged. Those skilled in the art will appreciate that if inputs 50 and 54 are complementary they may originate from logic circuits other than dynamic logic circuits. Accordingly, these inputs may originate from a latched circuit, for example.

The gate terminals 86 and 90 of active discharge devices PFETs 58 and 60, respectively, are connected to inputs 50 and 54 of stacked NFETs 70 and 74, respectively.

As well as providing for the elimination of bipolar parasitic leakage current, PFET pre-discharging intermediate nodes 62 and 64 also improves the noise immunity of dynamic logic circuit 44 by increasing the threshold voltage, Vt, of NFET transistors 70 and 74. The Vt of NFETs 70 and 74 is higher when PFET pre-discharging transistors 58 and 60, respectively, are present in dynamic logic circuit 44. The higher Vt increases the noise rejection of transistors 70 and 74. In other words, a higher magnitude of electrical noise voltage occurring at gates 50 and 54 of NFET transistors 70 and 74, respectively, is required to cause false switching in dynamic logic circuit 44.

In MOS FET transistors Vt is the threshold voltage at which point the transistor begins conducting current between the drain terminal and the source terminal, i.e. turns on. Accordingly, increasing the Vt increases the threshold at which the MOS FET transistor turns on. Therefore, a greater magnitude of spurious electrical noise voltage at the gate terminals is required to turn the MOS FET transistor on, thus causing a false switching of the dynamic logic circuit.

Figure 4:
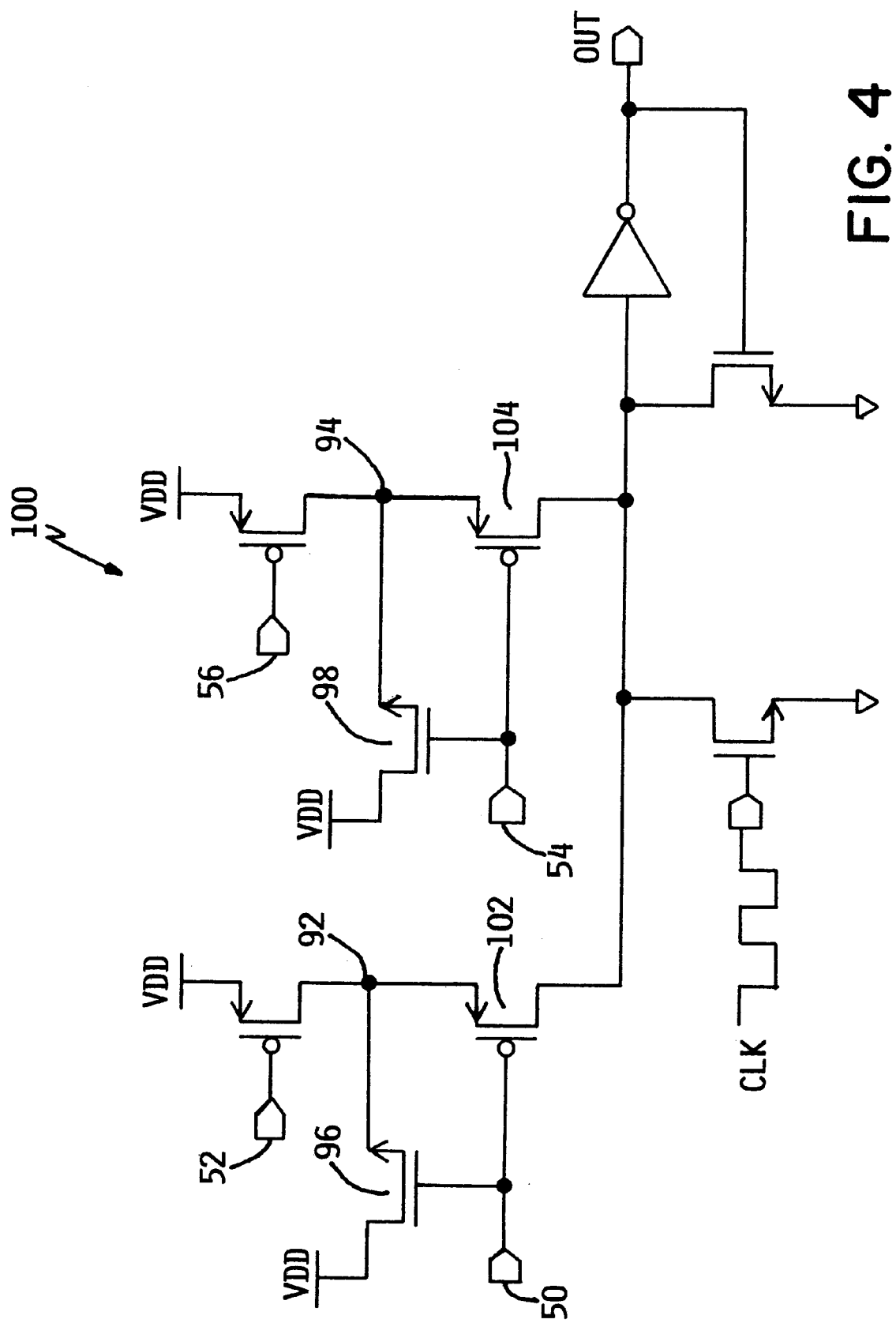
FIG. 4 is a dynamic logic circuit schematic diagram illustrating one embodiment of the present invention that eliminates the unwanted effects of the parasitic bipolar transistor device in SOI FET dynamic circuits using NFET pre-charging devices.

Given the symmetry of the FET devices, one skilled in the art would appreciate that similar results would be obtained if PFET transistors were replaced with NFET transistors and interconnected to perform the function of pre-charging the intermediate nodes of a dynamic logic circuit. FIG. 4 illustrates one embodiment of the present invention utilizing NFET transistors 96 and 98 to pre-charge intermediate nodes 92 and 94, respectively, of dynamic logic circuit 100.

Greater noise immunity in dynamic logic circuit 100 is achieved by utilizing NFET transistors 96 and 98 to precharge intermediate nodes 92 and 94, respectively. The NFET pre-charging transistors 96 and 98 increase the absolute value of the threshold voltage, Vt, of PFET transistors 102 and 104, respectively, thus improving the noise rejection capability of dynamic logic circuit 100.

The present invention has been described in its presently contemplated best mode, and it is clear that it is susceptible to various modifications, modes of operation and embodiments, all within the ability and skill of those skilled in the art and without the exercise of further inventive activity. Further, while the invention has been described in connection with what is presently considered the most practical and preferred embodiments, it is to be understood that the invention is not limited to the disclosed embodiments, but on the contrary, is intended to cover various modifications and equivalent arrangements included within the spirit and scope of the appended claims.

What is claimed is:

1. An apparatus for eliminating parasitic bipolar transistor action in a Silicon on Insulator (SOI) Metal Oxide Semiconductor (MOS) device comprising:
    a SOI electronic circuit having at least one field effect transistor (FET), said FET having a parasitic bipolar element, said FET being coupled to an intermediate node of said SOI electronic circuit; and
    an active discharging device coupled to said intermediate node of said SOI electronic circuit and discharging said node to a discharge voltage potential, whereby the parasitic bipolar element of said FET is deactivated.

2. The apparatus according to claim 1 wherein the SOI electronic circuit further comprises a plurality of field effect transistors.

3. The apparatus according to claim 2 wherein said transistors are N type Field Effect Transistors (NFET).

4. The apparatus according to claim 2 wherein said transistors are P type Field Effect Transistors (PFET).

5. The apparatus according to claim 2 wherein said transistors are stacked.

6. The apparatus according to claim 5 wherein said stacked transistors further comprise:
    a first transistor having a body, a drain terminal, a source terminal, and a gate input terminal;
    a second transistor having a body, a drain terminal, a source terminal, and a gate input terminal; and
    said first and second transistors being operatively coupled.

7. The apparatus according to claim 6 wherein said source terminal of said first transistor is coupled to said drain terminal of said second transistor defining a node.

8. The apparatus according to claim 7 wherein said active discharging device is a transistor having
    a drain operatively coupled to said node;
    a gate operatively coupled to said gate input terminal; and
    a source operatively coupled to a circuit common node.

9. The apparatus according to claim 8 wherein said stacked transistors are N type Field Effect Transistors (NFET) and said active discharging device is a P type Field Effect Transistor (PFET).

10. The apparatus according to claim 8 wherein said stacked transistors are P type Field Effect Transistors (PFET) and said active discharging device is a N type Field Effect Transistor (NFET).

11. The apparatus according to claim 8 further comprising a plurality of said stacked transistors.

12. The apparatus according to claim 11 wherein said plurality of said stacked transistors are connected in a parallel configuration.

13. The apparatus according to claim 12 wherein said stacked transistors are N type Field Effect Transistors (NFET) and said active discharging devices are P type Field Effect Transistors (PFET).

14. The apparatus according to claim 12 wherein said stacked transistors are P type Field Effect Transistors (PFET) and said active precharging device are N type Field Effect Transistors (NFET).

15. A Silicon on Insulator(SOI) dynamic logic circuit having an input, an output, and a clock, comprising:
    a plurality of stacked SOI Metal Oxide Semiconductor (MOS) transistors interconnected to perform a predetermined logic function defining a common node and an intermediate node, said stacked transistors being controlled by a respective plurality of inputs,
    said common node being coupled to a pre-charging device,
    said intermediate node being in a path between said common node and a discharge potential defined by said plurality of stacked SOI Metal Oxide Semiconductor transistors, said intermediate node being coupled to said common node by at least a first of said plurality of stacked SOI Medal Oxide Semiconductor transistors, and said intermediate node being coupled to said discharge potential by at least a second of said plurality of stacked SOI Metal Oxide Semiconductor transistors; and an active discharging transistor controlled by at least one of said plurality of inputs, said active discharge transistor defining a discharge path between said intermediate node and said discharge potential.

16. The dynamic circuit according to claim 15 wherein said stacked transistors are N-Field Effect Transistors (NFET) and said active discharging transistor is a P-Field Effect Transistor (PFET).

17. The dynamic circuit according to claim 15 wherein said stacked transistors are P-Field Effect Transistors (PFET) and said active discharging transistor is an N-Field Effect Transistor (NFET).

18. The dynamic circuit according to claim 15, wherein said pre-discharging device comprises transistors coupled to said stacked transistors.

* * * * *